United States Patent [19]
Tanaka et al.
[11] Patent Number: 4,734,659
[45] Date of Patent: Mar. 29, 1988

[54] ULTRASONIC OSCILLATOR

[75] Inventors: Yasuhisa Tanaka; Hiroyuki Takezi, both of Tachikawa; Masami Endoh; Makoto Yoneda, both of Oi, all of Japan

[73] Assignees: Ultrasonic Engineering Co., Ltd.; Toa Nenryo Kegyo Kabushiki Kaisha, both of Tokyo, Japan

[21] Appl. No.: 34,235

[22] Filed: Apr. 2, 1987

[30] Foreign Application Priority Data

Apr. 3, 1986 [JP] Japan .................................. 61-75477

[51] Int. Cl.$^4$ .......................... H03B 5/32; H03B 5/38

[52] U.S. Cl. .................................... 331/139; 331/158; 310/317

[58] Field of Search ........................ 331/139, 158, 160; 318/114, 119; 310/311, 314, 315, 317, 346

[56] References Cited

U.S. PATENT DOCUMENTS

| | | | |
|---|---|---|---|
| 578,461 | 3/1897 | Mertz | 239/498 |
| 1,659,538 | 2/1928 | Angrove | 239/433 |
| 1,730,664 | 10/1929 | Kruse | 239/590.5 |
| 1,758,119 | 5/1930 | Le Moon | 239/460 |
| 2,596,341 | 5/1952 | McCreery et al. | 239/590.5 |
| 2,712,962 | 7/1955 | Goddard | 239/500 X |
| 3,110,444 | 11/1963 | Eakins | 239/500 |
| 3,317,139 | 5/1967 | Freeland | 447/634 |
| 3,373,752 | 3/1968 | Inoue | 239/4 |
| 3,749,318 | 7/1973 | Cottell | 239/102 |
| 3,756,575 | 9/1973 | Cottell | 261/1 |
| 4,197,997 | 4/1980 | Wu et al. | 239/102 |
| 4,350,302 | 9/1982 | Gruber et al. | 239/500 |
| 4,372,491 | 2/1983 | Fishgal | 239/102 |
| 4,403,741 | 9/1983 | Moriya et al. | 239/585 |
| 4,408,722 | 10/1983 | Freland | 239/533.12 |
| 4,474,326 | 10/1984 | Takahashi | 239/102 |
| 4,496,101 | 1/1985 | Northman | 239/102 |
| 4,501,406 | 2/1985 | Walther et al. | 251/30 |
| 4,541,564 | 9/1985 | Berger et al. | 239/102 |
| 4,607,239 | 8/1986 | Ballato | 331/158 X |

FOREIGN PATENT DOCUMENTS

| | | | |
|---|---|---|---|
| 0159189 | 10/1985 | European Pat. Off. | 239/102 |
| 861344 | 7/1949 | Fed. Rep. of Germany . | |
| 2239408 | 2/1974 | Fed. Rep. of Germany | 313/239 |
| 786492 | 9/1935 | France | 239/498 |
| 197801 | 1/1978 | U.S.S.R. | 239/501 |

*Primary Examiner*—Eugene R. LaRoche
*Assistant Examiner*—David Mis
*Attorney, Agent, or Firm*—Seidel, Gonda, Goldhammer & Abbott

[57] ABSTRACT

In an ultrasonic oscillator which comprises an ultrasonic vibrator for driving an ultrasonic vibrator horn of an ultrasonic atomizer, a balanced circuit in which the ultrasonic vibrator is connected so that a balanced condition is established with respect to the damping capacity of the ultrasonic vibrator, and amplifier means for sending a signal to the balanced circuit and which includes a feedback circuit for positively feeding back the signal output from the balanced circuit, the feedback circuit is connected to means for adjusting the feedback quantity so that, when the ultrasonic oscillator starts the oscillation, the signal feedback quantity output from the balanced circuit is adjusted to make the gain of the amplifier means much greater than 1, and when the oscillator is in the steadily oscillating condition, the signal feedback quantity output from the balanced circuit is adjusted to broaden the allowable frequency band width of the ultrasonic vibrator.

10 Claims, 5 Drawing Figures

ULTRASONIC OSCILLATOR

BACKGROUND OF THE INVENTION

This invention relates generally to an ultrasonic oscillator, and particularly to an ultrasonic oscillator suitable for use in various ultrasonic atomizers, for example, fuel injection devices for automobiles.

Ultrasonic oscillators of this character are generally so constructed as to operate safely at a constant speed. They are roughly classified into two types; the load resistor type in which a resistor is connected in series with an ultrasonic vibrator that works as an electro-acoustic transducer to drive an ultrasonic vibrator horn provided in an ultrasonic atomizer, and the feedback resistor type in which a resistor is connected in series with a feedback circuit of an amplifier circuit which constitutes the ultrasonic oscillator. FIG. 3 illustrates a typical circuit structure of an ultrasonic oscillator of the load resistor type. The oscillator comprises an amplifier circuit 1; a matching coil 2 and a load resistor $R_2$7 connected to the output of the amplifier circuit 1, a balanced bridge circuit having capacitors 3, 4, and 5 and a damped capacity $R_1$ of an ultrasonic vibrator 6 and connected to said matching coil 2 and said load resistor $R_2$7; a feedback circuit which comprises a capacitor 8 and a coil 9 connected in series, and which positively feeds an output signal of the balanced bridge circuit back to the input of the amplifier circuit 1; and an input resistor $R_3$10 connected to the input of the amplifier circuit 1.

FIG. 4 illustrates a typical circuit of an ultrasonic oscillator of the feedback resistor type. Comparison of FIG. 4 with FIG. 3 reveals that the circuit of the ultrasonic oscillator of the feedback resistor type is generally the same as that of the load resistor type. The exception is that the feedback resistor type does not have the load resistor $R_2$7 employed in the load resistor type; instead, it has a feedback resistor $R_4$17 connected in series with the capacitor 8 and coil 9 in the feedback circuit.

The ultrasonic oscillator of the load resistor type has disadvantages. Because the electric current (i.e., vibrator current) of the ultrasonic vibrator 6 flows directly into the load resistor $R_2$7 via the capacitor 5, the power loss at the load resistor $R_2$7 (i.e., the magnitude of electric power wastefully consumed by the resistor) reduces the efficiency of the oscillator and makes it increasingly difficult to drive the ultrasonic vibrator 6 at a constant speed as the load on the vibrator increases. Such disadvantages common to the ultrasonic oscillators of the load resistor type have been experimentally confirmed by the present inventors.

FIG. 5 shows data measured by the present inventors. In the graph the ordinate represents the ratio of the vibration velocity v to the vibration velocity $v_0$ under the no-load condition of the vibrator 6. The abscissa represents the ratio of the equivalent series resistance $R_1$ of the ultrasonic vibrator 6 to the input resistance $R_3$10. Curves 11, 12, 13, 14, 15, and 16 represent the vibration velocity characteristics of the ultrasonic vibrator 6 using the ratios of the load resistance $R_2$7 to the input resistance $R_3$10 as parameters. The curves 11 through 16 represent the vibration velocity characteristics when $R_2/R_3=0$, 0.045, 0.09, 0.225, 0.45, and 0.9, respectively. FIG. 5 indicates that the ultrasonic vibrator 6 begins to work outside the constant-speed operation range as the values of the load resistance $R_2$7 and the equivalent series resistance $R_1$ of the ultrasonic vibrator 6 increase, and that the ultrasonic vibrator 6 operates at a constant speed independently of the equivalent series resistance $R_1$ only when the load resistance $R_2$7 is zero. The data imply that, in addition to the aforementioned defects, the ultrasonic oscillator of the load resistor type has a disadvantage of a low upper limit to the load with which the oscillator can continue the oscillation without coming to a halt (or stall). The oscillatable frequency band width of the amplifier circuit 1 in the steady-state condition, governed by the capacitor 8 and coil 9 in the feedback circuit and by the resistors $R_2$7 and $R_3$10, is narrower than the resonance frequency band width of the ultrasonic vibrator 6 that varies with changes in the temperature and in the load. A substantial limitation is thus imposed on changing the oscillation frequency according to changes in the resonance frequency of the ultrasonic vibrator 6. A further possibility is that transistors and other semiconductor amplifier elements are damaged by an over-excited input to the amplifier circuit 1.

As described above, the ultrasonic oscillator of the load resistor type has so many disadvantages that it is far from being of practical use. As compared with the load resistor type, the ultrasonic oscillator of the feedback resistor type may be said to be more trouble-free since it dispenses with the load resistor $R_2$7 that presents the above-mentioned disadvantages. Nevertheless, the present inventors have found that the feedback resistor type too has problems as described below.

(1) When an element having a resistance of a substantially lower value than the input resistor $R_3$10 is used as the feedback resistor $R_4$17:

Since the gain $\mu\beta$ of the circuit system is much greater than 1, the characteristics of the ultrasonic vibrator 6 at the start of oscillation, i.e., during the rise, and the upper limit of the load with which the oscillator continues the oscillation without stall is high. The circuit system further features improved constant-speed operation performance and improved efficiency common to the devices of the feedback resistor type. However, the frequency band width of the amplifier circuit 1 is so narrow that it cannot follow the vibrations in resonance frequency of the ultrasonic vibrator 6 with changes in the temperature and in the load, and semiconductor amplifier elements such as transistors can be broken down due to an over-excited input to the amplifier circuit 1.

(2) When an element having a resistance substantially greater than that of the input resistor $R_3$10 is used as the feedback resistor $R_4$17:

Contrary to the case (1) above, the amplifier circuit 1 has a broad oscillatable frequency band width, and there is no possibility of the semiconductor amplifier elements such as transistors being broken down by an over-excited input to the amplifier circuit 1. Moreover, the oscillator features the afore-mentioned advantages common to the feedback resistor type. However, since the feedback input voltage to the amplifier circuit 1 is divided by the feedback resistor $R_4$17 having a large resistance, the circuit system seldom produces a gain $\mu\beta >> 1$. The ultrasonic vibrator 6 starts to oscillate only when it is practically under no load, and the oscillator has a low upper limit of load with which it continues the oscillation without coming to a stall.

As stated above, even the ultrasonic oscillator of the feedback resistor type shows variations in its characteristics with the value of the feedback resistance. It behaves contrariwise depending on whether the feedback resistance is small or large.

SUMMARY OF THE INVENTION

The present invention has now been made to settle the aforedescribed problems of the prior art. Its object is to provide an ultrasonic oscillator which exhibits excellent characteristics both when the feedback resistance is substantially smaller, and when it is substantially larger, than the input resistance of the amplifier circuit.

The object is achieved by an ultrasonic oscillator according to the invention. In brief, the invention resides in an ultrasonic oscillator which comprises: an ultrasonic vibrator for driving an ultrasonic vibrator horn of an ultrasonic atomizer; a balanced circuit in which the ultrasonic vibrator is connected so that a balanced condition is established with respect to the damping capacity of the ultrasonic vibrator; and amplifier means for sending a signal to the balanced circuit and which includes a feedback circuit for positively feeding back the signal output from the balanced circuit; said feedback circuit having means connected thereto for adjusting the feedback quantity so that, when the ultrasonic oscillator starts the oscillation, the signal feedback quantity output from the balanced circuit is adjusted to make the gain of the amplifier means much greater than 1, and when the oscillator is in the steadily oscillating condition, the signal feedback quantity output from the balanced circuit is adjusted to broaden the allowable frequency band width of the ultrasonic vibrator.

DESCRIPTION OF THE PREFERRED EMBODIMENT

An embodiment of the present invention will now be described in conjunction with the drawings.

Figure 1:
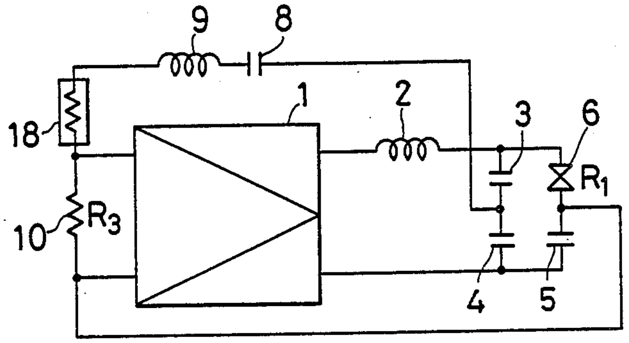
FIG. 1 is a circuit diagram of an ultrasonic oscillator of the feedback resistor type embodying the present invention.
Figure 4:
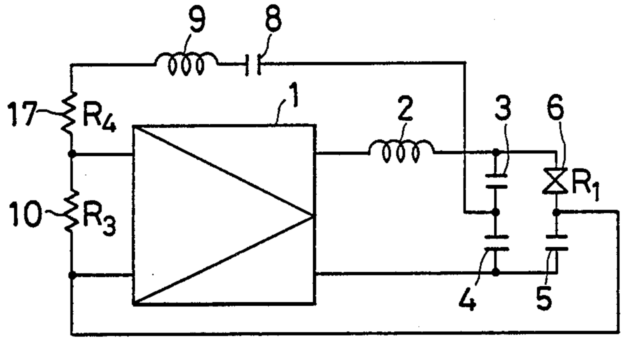
FIG. 4 PRIOR ART
FIG. 4 is a circuit diagram of a conventional ultrasonic oscillator of the feedback resistor type.
Figure 5:
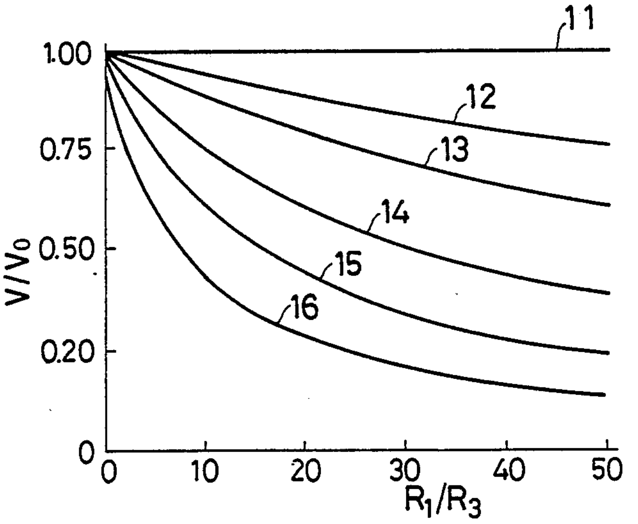
FIG. 5 is a graph showing the vibration velocity characteristics of the load resistance and equivalent series resistance of the ultrasonic vibrator of the oscillator shown in FIG. 3.

FIG. 1 is a diagram illustrating the circuit of an ultrasonic oscillator of the feedback resistor type embodying the present invention, similar to that of the feedback resistor type shown in FIG. 4. The ultrasonic oscillator of the feedback resistor type embodying the invention comprises an amplifier circuit 1; a balanced bridge circuit which consists of inductance elements, i.e., capacitor elements or capacitors 3, 4, and 5 connected to a matching coil 2 connected to the output of the amplifier circuit 1, and a damped capacity of an ultrasonic vibrator 6; a feedback circuit which consists of a capacitor 8, a coil 9, and feedback quantity adjusting means, i.e., a positive temperature coefficient resistance nonlinear element 18, all connected in series to feed positively the output signal from the balanced bridge circuit back to the input of the amplifier circuit 1; and an input resistor $R_3$10 connected to the input of the amplifier circuit 1. The afore-mentioned amplifier means consists of the amplifier circuit 1 and the feedback circuit.

The output from the amplifier circuit 1 is set to a constant voltage, and the inductance of the matching coil 2 is so set as to attain conjugate matching with the load side (i.e., with the balanced bridge circuit consisting of capacitors 3, 4, 5 and the damped capacity of the ultrasonic vibrator 6) as viewed from the output terminal of the amplifier circuit 1 at a resonance frequency of the ultrasonic vibrator 6. The capacitors 3, 4, and 5 forming the balanced bridge circuit are such that they establish a balanced bridge condition $C_3 \cdot C_5 = C_4 \cdot C_d$ between their capacitances $C_3$, $C_4$, $C_5$ and the damping capacity $C_d$.

The positive temperature coefficient resistance nonlinear element 18 is connected in series with the capacitor 8 and coil 9 in the feedback circuit. It divides part of the output signal from the amplifier circuit 1 between itself and the input resistor $R_3$10. The output signal from the amplifier circuit 1 is input to the balanced bridge circuit and thence positively fed back from the bridge circuit to the input of the amplifier circuit 1 via the capacitor 8 and coil 9. At the start of oscillation, i.e., during the rise of the circuit system, the positive temperature coefficient resistance nonlinear element 18 has a resistance much smaller than that of the input resistor $R_3$10. Consequently, the circuit system satisfies a requirement $\mu\beta >> 1$ (meaning that the gain of the circuit system is much greater than unity) necessary for the rise of oscillation. The circuit system thus exhibits good rising characteristics. While the circuit system is in a steadily oscillating condition, the positive temperature coefficient resistance nonlinear element 18 provides a resistance much greater than that of the input resistor $R_2$10 to satisfy the requirement of $\mu\beta = 1$. The circuit system, therefore, is capable of changing the oscillation frequency to follow the changes in resonance frequency of the ultrasonic vibrator 6. The gain $\mu\beta = 1$ is obtained and the circuit system stabilized at a point where the oscillation frequency of the circuit system is matched with the varied resonance frequency of the ultrasonic vibrator 6. A preferred example of the positive temperature coefficient resistance nonlinear element 18 is a tungsten resistance used for lamps, for example, or an N-type valence-controlled semiconductor called Posistor (trademark of a product by Murata Mfg. Co.). When the tungsten resistance is employed, it is most desirable that the resistance be used with less than 70% of the rated current and that such a lamp be adopted that the resistance R (Ω) and the feedback current I (mA) satisfy a relation $R = 7.36 e \times p\ (0.015\ I)$.

Figure 2:
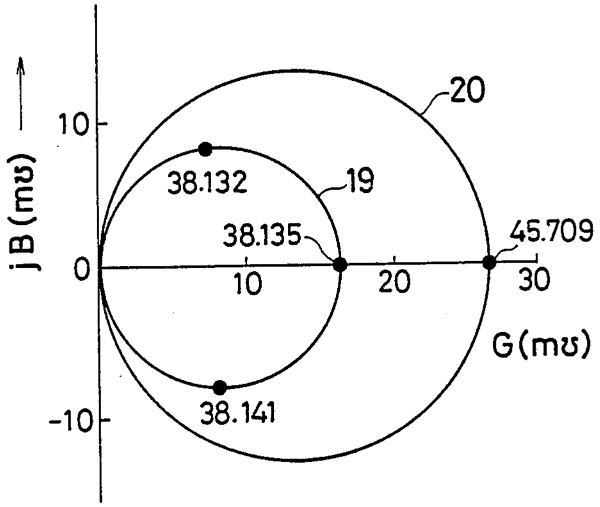
FIG. 2 is a graph showing dynamic characteristics of an ultrasonic vibrator when the oscillator shown in FIG. 1 is incorporated in an ultrasonic atomizer.
Figure 3:
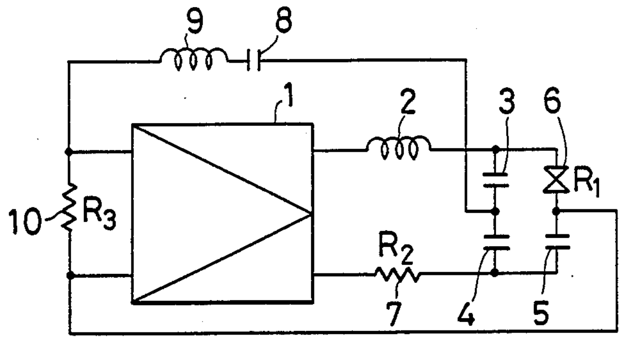
FIG. 3 PRIOR ART
FIG. 3 is a circuit diagram of a conventional ultrasonic oscillator of the load resistor type.

FIG. 2 shows dynamic characteristics of the ultrasonic vibrator in an ultrasonic atomizer which incorporates the ultrasonic oscillator of the feedback resistor type built as above.

In FIG. 2, a circle 19 represents a fundamental wave oscillation mode, and a circle 20 represents a spurious oscillation mode. Numerical values 38.132, 38.135, 38.141, and 45.709 represent frequencies (KHz) at the points indicated by solid dots. In the spurious mode 20, oscillation is suppressed by filtration through the capacitor 8 and coil 9 in the feedback circuit.

Table 1 clearly shows the differences between the effects achieved by the ultrasonic oscillator of the feedback resistor type embodying the present invention and the effects of the existing oscillators.

According to the present invention as described above, the feedback circuit is connected with feedback quantity adjusting means to adjust the feedback quantity of the signal output from the balanced circuit so that the gain of the amplifier means will become much greater than unity when the oscillator starts to oscillate, and to adjust the feedback quantity of the signal output from the balanced circuit so that the allowable frequency band of the ultrasonic vibrator is broadened when the oscillator is in the steadily oscillating condition. An ultrasonic oscillator is thus provided which exhibits excellent characteristics both when it starts oscillation and when it is in the steadily oscillating condition.

TABLE 1

| | Conventional oscillator | | | Oscillator | |
|---|---|---|---|---|---|
| | Load resis- | Feedback resistor type | | of the | Meaning of term |
| Item | tor type | $R_4 << R_3$ | $R_4 >> R_3$ | invention | (criterion) |
| Rise | O | O | X | O | Upper-limit load for the start of oscillation "O" when the upper-limit load is high.) |
| Stall | X | O | X | O | Upper-limit load that causes the oscillation to stop ("O" when the upper-limit load is high.) |
| Constant speed | X | O | O | O | Rate of speed variation based on no-load speed of ultrasonic vibrator ("O" when the variation rate is low.) |
| Efficiency | X | O | O | O | Overall electroacoustic conversion efficiency ("O" when the efficiency is high.) |
| Band width | X | X | O | O | Frequency band "O" when the band is broad.) |
| Safety of transistor | X | X | O | O | Whether the transistor is over-excited or not ("X" when over-excited.) |

What is claimed is:

1. An ultrasonic oscillator comprising an ultrasonic vibrator for driving an ultrasonic vibrator horn of an ultrasonic atomizer; a balanced circuit in which the ultrasonic vibrator is connected so that a balanced condition is established with respect to the damped capacity of the ultrasonic vibrator; and amplifier means for sending a signal to the balanced circuit and which includes a feedback circuit for positively feeding back the signal output from the balanced circuit; said feedback circuit having means connected thereto for adjusting the feedback quantity so that, when the ultrasonic oscillator starts the oscillation, the signal feedback quantity output from the balanced circuit is adjusted to make the gain of the amplifier means much greater than 1, and when the oscillator is in the steadily oscillating condition, the signal feedback quantity output from the balanced circuit is adjusted to broaden the allowable frequency band width of the ultrasonic vibrator.

2. An ultrasonic oscillator according to claim 1, wherein said balanced circuit consists of a bridge circuit in which said ultrasonic vibrator and capacitor elements are connected.

3. An ultrasonic oscillator according to claim 1, wherein an inductance element is connected between the output of said amplifier means and said balanced circuit to obtain conjugated matching with the load side as viewed from the output of said amplifier means at a resonance frequency of said ultrasonic vibrator.

4. An ultrasonic oscillator according to claim 1, wherein said feedback quantity adjusting means consists of a positive temperature coefficient resistance nonlinear element.

5. An ultrasonic oscillator according to claim 4, wherein said positive temperature coefficient resistance nonlinear element consists of a tungsten resistance or an N-type valence-controlled semiconductor.

6. An ultrasonic oscillator according to claim 2, wherein an inductance element is connected between the output of said amplifier means and said balanced circuit to obtain conjugated matching with the load side as viewed from the output of said amplifier means at a resonance frequency of said ultrasonic vibrator.

7. An ultrasonic oscillator according to claim 2 wherein said feedback quantity adjusting means consists of a positive temperature coefficient resistance nonlinear element.

8. An ultrasonic oscillator according to claim 3, wherein said feedback quantity adjusting means consists of a positive temperature coefficient resistance nonlinear element.

9. An ultrasonic oscillator according to claim 7, wherein said positive temperature coefficient resistance nonlinear element consists of a tungsten resistance or an N-type valence-controlled semiconductor.

10. An ultrasonic oscillator according to claim 8, wherein said positive temperature coefficient resistance nonlinear element consists of a tungsten resistance or an N-type valence-controlled semiconductor.

* * * * *